United States Patent
Tomanek et al.

(10) Patent No.: US 6,400,154 B2
(45) Date of Patent: Jun. 4, 2002

(54) MULTIPLE TUNABLE DOUBLE RING SURFACE COIL WITH HIGH $B_1$ HOMOGENEITY

(75) Inventors: Boguslaw Tomanek, Colpany; Vyacheslav Vlolovskyy, Winnipeg, both of (CA)

(73) Assignee: National Research Council of Canada, Ottawa (CA)

( * ) Notice: Subject to any disclaimer, the term of this patent is extended or adjusted under 35 U.S.C. 154(b) by 0 days.

(21) Appl. No.: 09/754,054

(22) Filed: Jan. 5, 2001

Related U.S. Application Data

(60) Provisional application No. 60/174,592, filed on Jan. 5, 2000.

(51) Int. Cl.[7] .................................. G01V 3/00
(52) U.S. Cl. ................... 324/318; 324/309; 324/322
(58) Field of Search .................. 324/318, 322, 324/311, 313, 300, 309; 128/653

(56) References Cited

U.S. PATENT DOCUMENTS

| | | | |
|---|---|---|---|
| 4,742,304 A | | 5/1988 | Schnall et al. ............... 324/318 |
| 5,243,289 A | * | 9/1993 | Mlum et al. ................. 324/322 |

OTHER PUBLICATIONS

Paper published by Boguslaw Tomanek, Lawrence Ryner, David I. Hoult, Piotr Kozlowsk8 & John K. Saunders entitled "Dual Surface Coin with High–B1 Homogeneity for Deep Organ MR Imaging" (6 pages) in Magnetic Resonance Imaging vol. 15, No. 10, pp. 1199–1204 (1997).

Paper published by Scott B. King, Lawrence N. Ryner, Boguslaw Tomanek, Jonathan C. Sharp & Ian C.O. Smith entitled "MR Spectroscopy Using Multi–Ring Surface Coils" (10 pages) in Magnetic Resonance in Medicine 42:655–664 (1999).

* cited by examiner

Primary Examiner—Edward Lefkowitz
Assistant Examiner—Brij B. Shrivastav
(74) Attorney, Agent, or Firm—Adrian D. Battison; Michael R. Williams; Ryan W. Dupuis

(57) ABSTRACT

To perform multinuclear magnetic resonance spectroscopy and imaging, a coil with a high signal-to-noise ratio and spatially uniform $B_1$ field that covers the same volume of interest at several frequencies is preferred. A radio frequency surface coil probe that produces a homogeneous field within the same volume for both $^{31}P$ and $^1H$ is described. The probe provides signal to noise characteristics close to those of a single frequency double ring assembly. It acquired excellent proton images and $^{31}P$ spectra from an image selected voxel in rat liver at 7 T. The probe uses a double ring construction where each ring is tuned by a parallel LC trap to two or more different frequencies. A calculation of the values of the inductance and capacitance allows the double coil arrangement to be tuned to the required frequencies with a peak of the homogeneity at each frequency occurring at the same distance from the coil and with good Q. The probe is powered by a driver coil adjacent to the probe by mutual inductance.

19 Claims, 4 Drawing Sheets

MULTIPLE TUNABLE DOUBLE RING SURFACE COIL WITH HIGH $B_1$ HOMOGENEITY

This appln claims benefit of Prov. No. 60/174,592 filed Jan. 5, 2000.

This invention relates to a probe for use in nuclear magnetic resonance experiments and to a method for use in such experiments.

BACKGROUND OF THE INVENTION

In magnetic resonance experiments on a sample within a magnetic field, the RF field, generally known as the B1 field, is generated by an NMR probe located at or adjacent the sample. The probe can be provided by a surface coil arrangement which is generally planar and located immediately adjacent the surface of the sample for experiments on a volume of interest within the sample and spaced from the plane of the probe. Surface coils are widely used in magnetic resonance imaging (MRI) and spectroscopy (MRS) due to their high sensitivity. The sensitivity, however, decreases rapidly with increasing distance between the coil and the volume of interest due to the non-homogeneous excitation as well as signal reception. This results in variations in the intensity of MR images and adversely affects MRS experiments.

Some attempts to overcome this have used composite or adiabatic pulses applied to the probe, although these require relatively high RF power.

In the alternative, volume coils, which are no longer planar, can provide a homogeneous $B_1$ but with a reduced signal to noise ratio (SNR) compared to surface coils. Separate transmit and receive coils are often used. In this case a volume coil or a large surface coil provides a highly homogeneous $B_1$ field and a smaller receiving surface coil is used to obtain high SNR. However, such a configuration still suffers from inhomogeneous signal reception and the small coil must be actively de-coupled requiring cumbersome electronics that tends to introduce additional noise and reduce the SNR. In addition, high RF power is required for excitation, often limiting the pulse sequences not to exceed specific absorption rate (SAR) limits.

A dual-ring surface coil with the sensitivity and power requirements of a traditional surface coil and the $B_1$ homogeneity of a volume coil over a targeted volume of interest has been described in a paper published by Tomanek B. Ryner L, Hoult D I, Kozlowski P, Saunders J K entitled Dual Surface Coil with High-$B_1$ Homogeneity for Deep Organ MR Imaging in Magn Reson Imag 1997; 10:1199–1204. Further details are published in a paper published by King S B, Ryner L N, Tomanek B, Sharp J C, Smith I C P entitled MR Spectroscopy using Multi-Ring Surface Coils in Magn Reson Med 1999; 42:655–664.

This arrangement is used for $^1H$ MR imaging and $^1H$ spectroscopy. In this design an additional inductively coupled coaxial ring produces a $B_1$ field that compensates for the roll-off of the $B_1$ field produced by a larger surface coil resulting in high $B_1$ homogeneity over a specified volume.

The combination of MR imaging with spectroscopy provides a powerful tool for clinical management of problems such as stroke, tumor monitoring and the assessment of other diseases. Especially the integrated acquisition of proton images and localized spectra is essential for the practical application of spectroscopic techniques to human and animal research and it is highly desirable to use a single RF probe in order to minimize operational problems such as changing coils from one experiment to another. Advantages of a such a probe in the form of a double-tuned coil also include more accurate localization of spectra and easier shimming for $^{31}P$ spectroscopy since the shimming can be done at the $^1H$ frequency with the same coil over the same volume. Absolute quantitation methods using proton signal are as well easier to perform when correction for substantially different $B_1$ profile is not required.

Early publications on double resonant RF devices dealt mostly with surface coils. One example is shown in U.S. Pat. No. 4,742,304 of Schnall et al issued May 3, 1988 which discloses a frequency splitting circuit used on a simple coil which allows the coil to resonate at two separate frequencies which can be tuned to the required frequencies for the nuclei under examination. However this arrangement has the disadvantages of the simple surface coil of the inhomogeneous B1 field leading to high levels of surface effects which interfere with the analysis of the signals from the volume of interest, often requiring surgical removal of skin and overlying tissue to allow effective investigation of an underlying tissue of interest.

While the above patent thus provides an arrangement for simultaneous investigation at the two or more required different frequencies for a simple coil, this technique could not be applied to more complex coil arrangements since the formulae disclosed for calculating the values of the inductive and capacitive components for the frequency splitting circuit could not be applied to more complex coil arrangements. Experimental analysis of the values required for more complex coil constructions is simply not practical because of the complex mutual induction between the coil components.

Recent assemblies for double resonant RF devices have therefore abandoned the above patent and are instead mostly based on volume coils where coaxial inserted birdcage resonators are often employed. Such a set-up implies for volume coils usually a high power requirement and lower SNR; very often VOI for two frequencies are not the same because of different size or position of coaxial resonators.

SUMMARY OF THE INVENTION

It is one object of the present invention to provide a method for use in simultaneous nuclear magnetic resonance experiments at two different predetermined frequencies matched to the resonant frequencies of two different nuclei using a probe of the surface coil type.

The present invention provides a combination of a multi-ring surface coil in which each coil includes a multi frequency trap circuit. The present invention provides a technique for calculating the inductance and capacitance values necessary to tune the probe defined by the combined surface coils to the required frequencies, while at the same time locating the peak of maximum homogeneity at the same distance from the plane of the coil and at the same time providing acceptable Q values for effective experiments.

In the example presented herein, imaging is performed on the $^1H$ nucleus while spectroscopy is performed on the $^{31}P$ nucleus. However other frequencies can be selected for analysis of different nuclei.

Thus the $B_1$ field for the nuclear magnetic resonance experiments is transmitted to the sample most efficiently from a resonant RF surface coil placed in proximity to the sample and connected to the RF driving apparatus. Either the same probe or a second probe can be connected to the RF receiving apparatus to receive the MR signals which are induced by the precessing magnetism of the nuclei in conventional manner.

The probe of the present invention provides the following advantages

1. Operation of the probe at two or more frequencies for both sequential and simultaneous acquisition of MR data from two or more nuclei.

2. Good or improved homogeneity of the RF field where the peak of maximum homogeneity is at the same distance from the coil for both or all of the different frequencies. This allows the following:

a) an improved spatial localization since the higher RF field homogeneity, the more precisely the voxel of interest can be chosen;
   b) an improved water suppression since the higher RF field homogeneity, the better efficiency of water peak suppression procedure.
   c) an improved ability to measure mean metabolite concentrations quantatively over a tissue volume since in homogeneous RF field the NMR signal directly corresponds to metabolite concentration, but for non-homogeneous RF field, its complicated non-linear spatial dependence should be taken into account.

3. Improved signal to noise ratio relative to volume coils.

4. Reduced transmitter power requirements relative to volume coils.

5. The ability to shim, that is slightly adjust, the magnetic field using the relatively stronger signal received from one nucleus (which is in the example described hereinafter the proton or $^1H$ nucleus), while performing spectroscopy with the relatively weaker signal received from a different nucleus (which is in the example the $^{31}P$ nucleus).

6. Decreased contamination from signals generated outside the volume of interest and particularly by surface material of the sample immediately adjacent the surface probe such as the skin and adjacent tissues of an animal or human sample.

In the example described hereinafter there are two rings which are circular, coaxial, straight and either parallel or coplanar. However the number of rings can be different from two. The rings do not need to be parallel or straight but in general the rings lie in or adjacent to a surface plane which defines the surface of the probe for placing immediately adjacent the surface of the sample. The number of resonant frequencies is preferably two but can be increased from that number by increasing the number of inductor-capacitor (LC trap) combinations in each of the rings.

BRIEF DESCRIPTION OF THE DRAWINGS

One embodiment of the invention will now be described in conjunction with the accompanying drawings in which.

DETAILED DESCRIPTION

Figure 1:
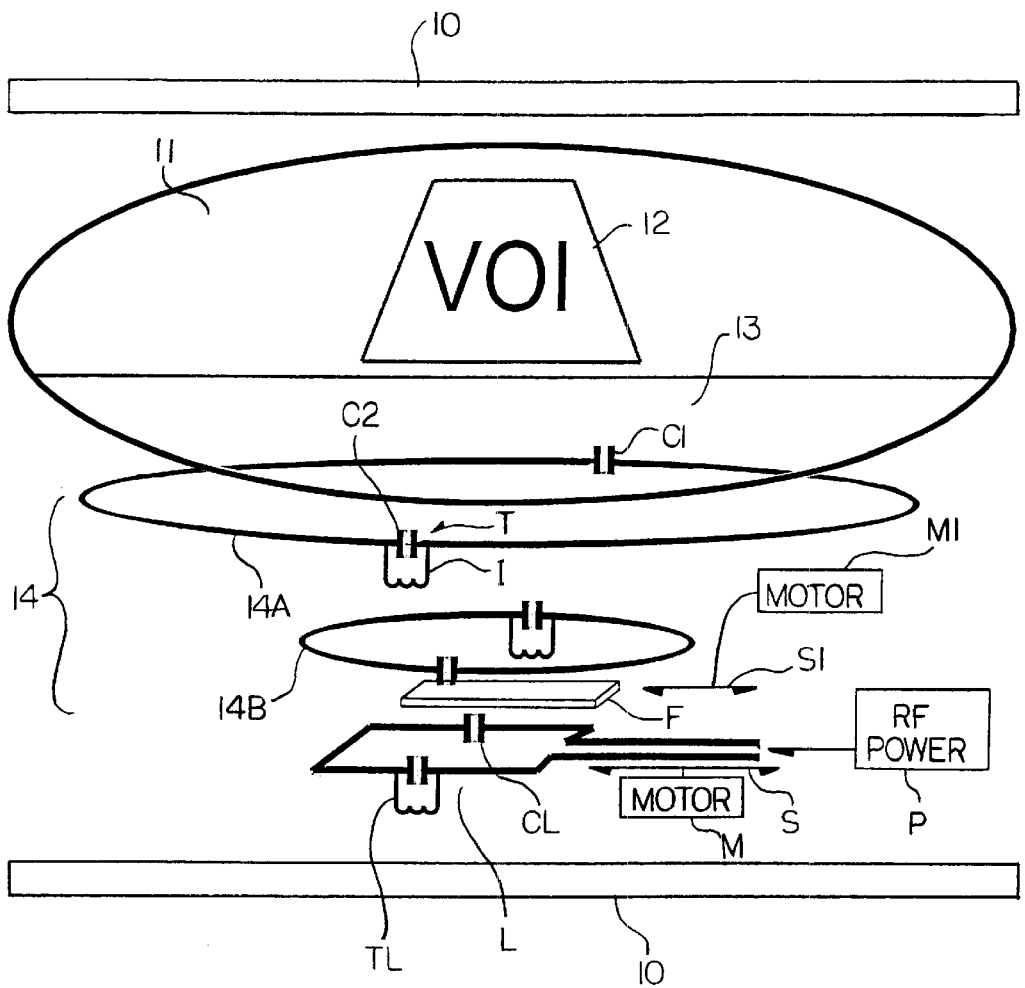
FIG. 1 is a schematic illustration of the probe and method according to the present invention and particularly the geometry of the double tuned dual surface coil forming the probe.
Figure 3:
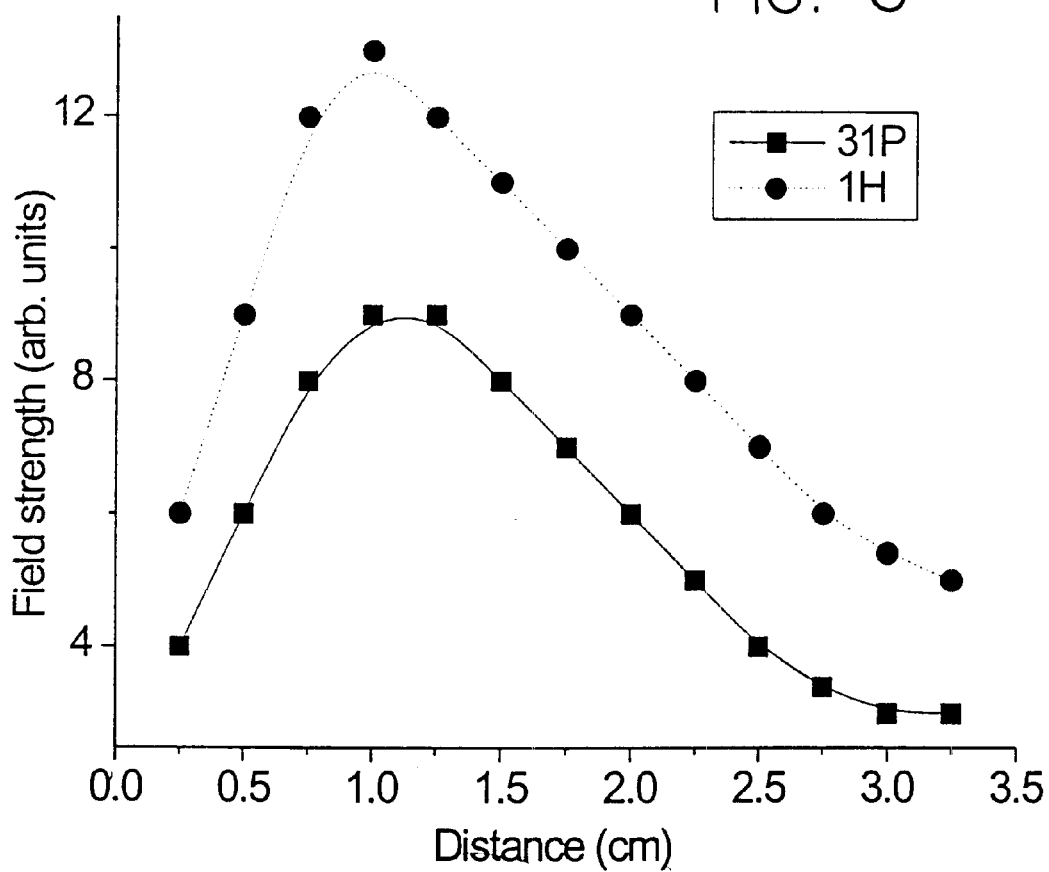
FIG. 3 is a graph plotting the B1 field (arbitrary units) produced by the two-coil assembly at different frequencies.

In FIG. 1 is shown schematically the components for magnetic resonance experiments including a magnet 10 within the field of which is located a sample 11 having a volume of interest within the sample indicated at 12 and a surface area of the sample indicated at 13. A surface probe 14 is located immediately adjacent the surface area 13 of the sample. The probe includes two coils 14A and 14B which in the example are coplanar, coaxial, circular and straight. However the coils do not have to have any of these characteristics except that they need to be arranged so that they provide mutual inductance with one coil generally inside the other so that it is smaller in transverse dimension and with both coils forming a surface coil arrangement thus defining generally a plane of the probe which is arranged at a surface of the sample generally in contact therewith.

The two coils are housed within a suitable container which locates the coils in position and maintains them fixed relative to each other. The housing provides insulation to prevent current from being directly communicated from the coils to the surface of the sample.

Each coil includes a capacitor C1 together with an LC trap circuit T including a capacitor C2 and an inductance I. This arrangement as explained hereinafter provides tuning of each of the two coils separately to two different resonant frequencies.

The coils are powered with the RF oscillating current by mutual inductance with a driving loop L which itself has capacitor CL and trap circuit TL. The driver loop L is mounted on a support schematically indicated at S which is driven longitudinally in a plane parallel to the plane of the probe by a manual drive or motor schematically indicated at M. A foil conductor F is positioned between the plane of the loop L and the plane of the probe and is again mounted on a support S1 and driven longitudinally in a plane parallel to the plane of the probe by a manual drive or motor schematically indicated at M1. The motor M and motor M1 are controlled to effect matching of the impedance (generally 50 OHMS) of the probe relative to the impedance of the power source P and also to effect fine tuning of the resonant frequencies using techniques well known to one skilled in the art. The current ratio is −1.4:1 for both $^1H$ and $^{31}P$ nuclei.

Figure 2:
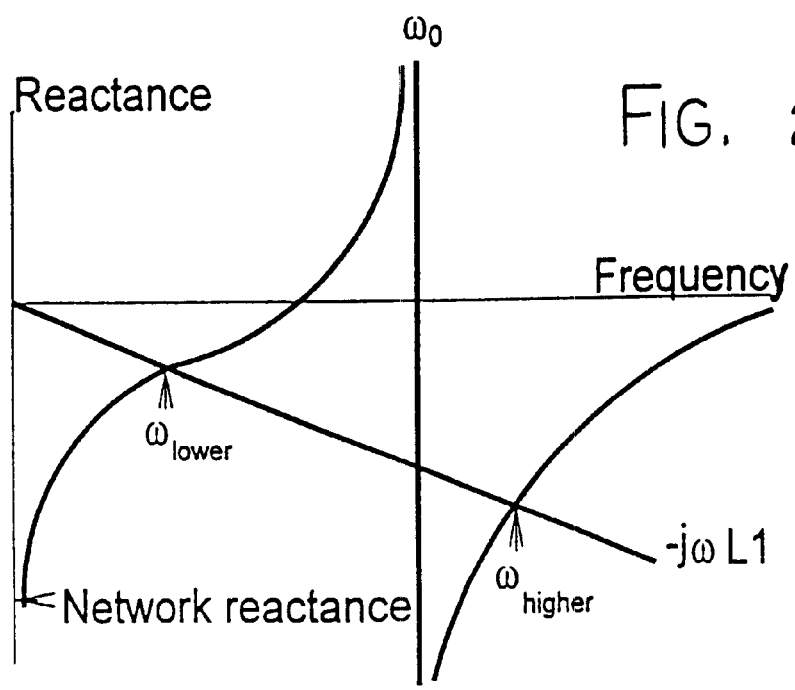
FIG. 2 is a graph of the reactance of the probe as a function of frequency where $\omega_0$ is the resonance of the parallel trap L2 and C2.
Figure 4:
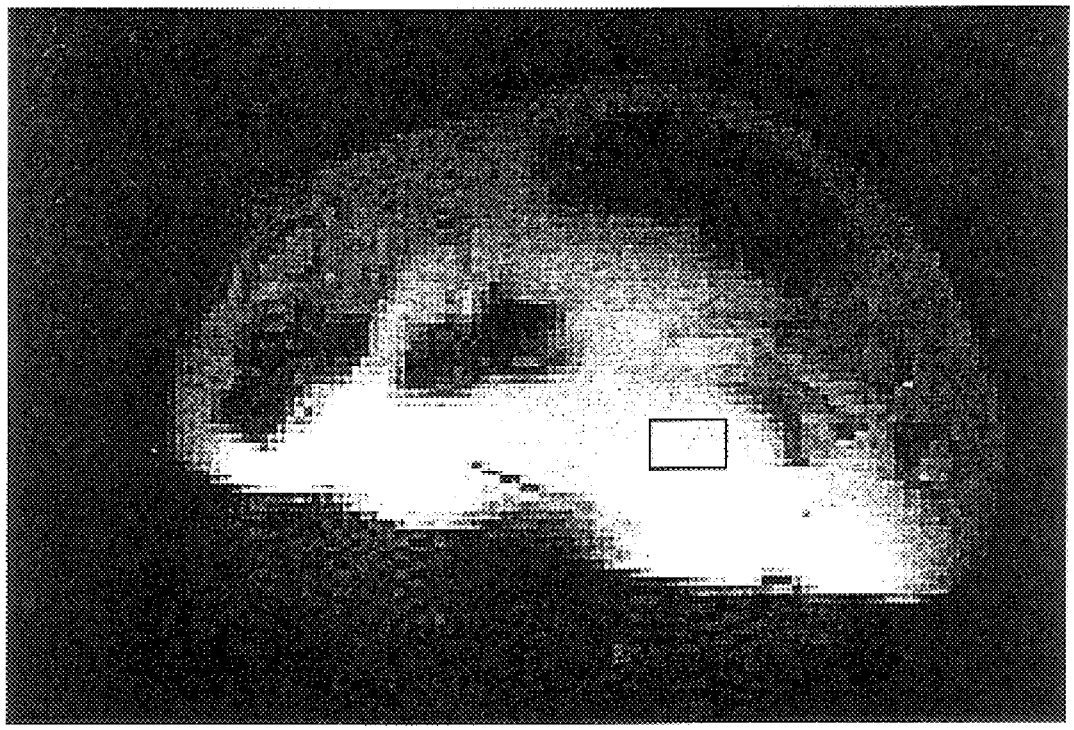
FIG. 4 is a snapshot-flash proton image of a rat liver obtained with the dual surface coil of FIG. 1.
Figure 5:
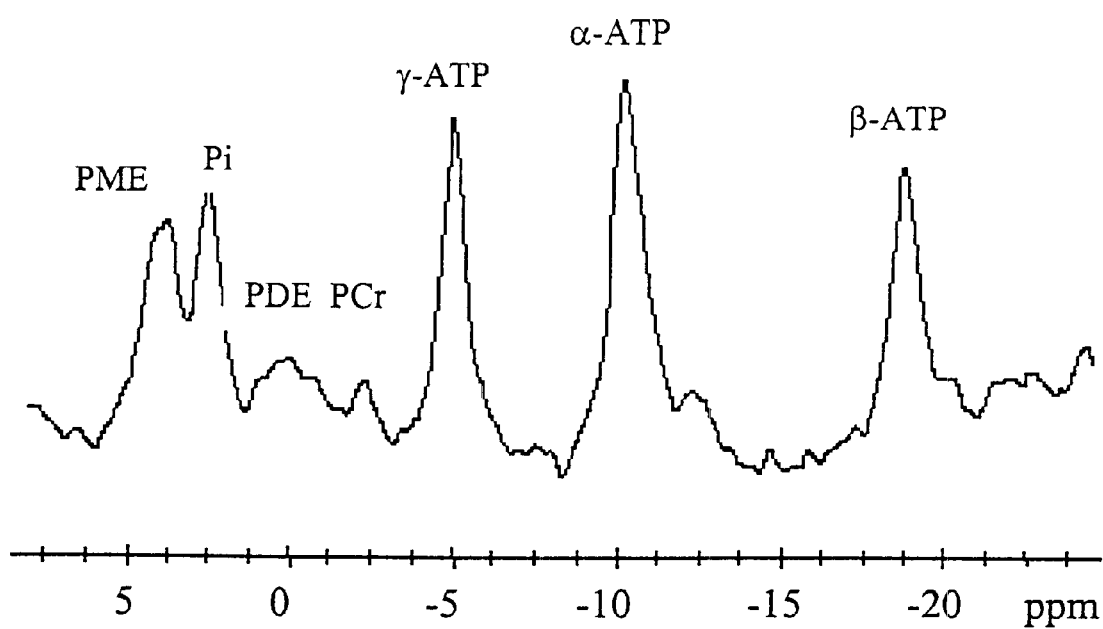
FIG. 5 is a phosphorus spectrum from a voxel of the same liver.

In FIG. 2 is shown the plots of the B1 field produced at the two different resonant frequencies where position X=0 corresponds to the plane of the ring 14A of the probe. The ring 14B can lie in the same plane or can be offset slightly away from the plane. The field was measured at frequencies of 121.5 MHz for $^{31}P$ and 300 MHz for 1H. It will be noted that the field at each frequency generates a peak at a position spaced from the plane of the probe with the field B1 being relatively low immediately adjacent the plane. At the peak there is provided maximum homogeneity in that the field is substantially constant over the area adjacent the distance which is in the example 1.0 cm from the plane. It will be noted that the distance of the peak for each of the two frequencies is equal and an example shown is at the 1.0 cm distance.

The multi ring concept provides high $B_1$ homogeneity within a specific VOI. An opposite current in the small ring acts to compensate for the roll-off of the $B_1$ field associated with a single surface coil (large ring). Thus in the selected VOI the resulting superposition of two RF fields provides improved homogeneity of $B_1$. To conduct MRI and MRS on a rat liver it is necessary to create a desired region of interest 10 to 15 mm deep inside the rat abdomen. To achieve a homogeneous $B_1$ field of proper frequency at a given VOI resonant frequencies and currents in individual rings were calculated using the Biot-Savart law. It was found that the following parameters provided the best $B_1$ homogeneity within VOI: diameters of small and large coils are 15 and 40 mm respectively with current ratio −1.4:1 for both $^{31}$P and $^1$H, and distance between coils of 4 mm.

To make the assembly resonate at 121.5 MHz and 300 MHz, the resonance frequencies of the small ring are calculated, using the calculations set out hereinafter, to be 113.7 MHz and 291.3 MHz. The large ring then has to resonate at 118 MHz and 296.3 MHz. Distributed capacitance reduces conservative electric field losses within the sample. Placing a metal foil between the capacitors and the sample reduced the remaining losses. Coupling between the rings and the double-resonant matching loop is achieved by a mutual inductance. Since the assembly in one example is constructed for a narrow bore magnet, a rectangular (40 mm×50 mm) loop sliding along the bore is used for convenient matching. A fine tuning to one or the other frequency is achieved by using the narrow strip of a metal foil moving between the matching coil and the dual coil assembly. All coils can be made of 1.6 mm diameter tinned copper wire.

To achieve a double resonance of the coil each ring has to resonate at two frequencies, therefore the frequency splitting network is used. For a simple single frequency probe resonance is established when the capacitor reactance $-1/j\omega C$ and the coil reactance $j\omega L$ compensate one another. Adding the parallel LC trap in series with such a coil creates the frequency-splitting network. The reactance of this network, as a function of frequency, begins being capacitive, then passes through a pole at the frequency corresponding to the resonance of the trap, and then becomes capacitive again. The reactance curve crosses the anti-reactance curve of the coil twice and this results in two resonance frequencies. Parameters of the splitting circuit must be chosen such that its frequency $\omega_0$ lies between frequencies of interest $\omega_{lower}$ and $\omega_{higher}$ (in the present case, 121.5 MHz for $^{31}$P and 300 MHz for $^1$H at 7 T).

In order to preserve high magnitude of Q for both frequencies, it is desirable to keep the splitter inductance L2 at about 25% of the inductance of main coil L1. Following this recommendation, similar values of Q for both resonant frequencies can be experimentally achieved. It is found that a slight RF field created by a parallel LC trap does not influence $B_1$ homogeneity. The whole assembly is mounted on 2 mm plastic (high density polyethylene) support.

Plots of the axial $B_1$ fields produced by a loaded dual-coil assembly at two frequencies of interest and measured by Network Analyzer HP 8752A (Hewlett Packard, Santa Rosa, Calif.; USA) using a small search probe are shown in FIG. 2. The field strength is measured and presented in arbitrary units. It can be seen that the regions of $B_1$ homogeneity for both frequencies overlap and correlate with the theoretical calculations, used to optimize ROI depth. The value of Q (where $Q=\omega L/R$) for the unloaded assembly is 160 at both frequencies. When the coil is loaded with a cylinder of 22 cm diameter and 17 cm high filled with physiological saline which placed 2 mm above the outermost ring, corresponding values of Q decreased to 105 and 75 for 121.5 MHz and 300 MHz respectively. In order to operate suitable, it is desirable for Q to be above 100 and is preferably approximately equal for both peaks. This can only be obtained by calculation of the inductance and capacitance values using the formulae set out hereinafter.

To obtain the desired current ratio, the inductance and reactance of both rings must be calculated to find the appropriate resonance frequencies of each ring. The mutual inductance between the rings, calculated from the coil geometry (ring radii and distance between them), then causes the two-ring set to resonate exactly at the Larmor frequency. To make the coil resonate at two frequencies, a splitting network reactance can be included.

The mutual inductance $M_{12}$ between two circuits can be expressed as $$M_{12} = \frac{\mu_0}{4\pi} \oint_1 \left[ \oint_2 \frac{ds_1}{d_{12}} \right] ds_2 \quad [1]$$

where $\mu_0$ is the permeability of free space, $ds_1$ and $ds_2$ are elements of circuit 1 and 2 respectively and $d_{12}$ is the distance between them. Based on the Lenz's law, the reactance of the first and the second ring is $$X_1 = \frac{V_1}{I_1} = -j\omega_0 M_{12} \frac{I_2}{I_1} \quad [2]$$

$$X_2 = \frac{V_2}{I_2} = -j\omega_0 M_{12} \frac{I_1}{I_2}. \quad [3]$$

On the other hand the reactance of a ring with inductance $L_p$, capacitance $C_p$, and frequency splitting network with a choke $L_{spl}$ and capacitance $C_{spl}$ is given by $$X_p = X_{L_p} + X_{C_p} + X_{spl} \quad [4]$$

$$= j\omega_0 L_p + \frac{1}{j\omega_0 C_p} + \frac{j\omega_0 L_{spl} \frac{1}{j\omega_0 C_{spl}}}{j\omega_0 L_{spl} + \frac{1}{j\omega_0 C_{spl}}}.$$

The ring inductance can be approximated as $$L_p \approx \mu_0 r_p \left\{ \ln\left(8\frac{r_p}{b_p}\right) - 2 \right\} \quad [5]$$

where $r_p$ is the radius of the ring and $b_p$ is the radius of its cylindrical conductor. The choke inductance $L_{spl}$ is chosen to be approximately 25% of the inductance of main ring $L_p$ (12). The tuning capacitance $C_p$ and splitting network capacitance $C_{spl}$ required for each ring can be calculated when comparing the reactance in Eq. [2] and [4] (for a small ring) and in Eq. [3] and [4] (for a large ring) at two resonance frequencies (e.g. 121.5 MHz and 300 MHz). The resonance frequency of each ring is then found by solving the equation $$X_{L_p} + X_{C_p} + X_{spl} = 0. \quad [6]$$

After tuning each ring to the appropriate frequency the rings are brought together to form the multi-ring surface coil. The two rings couple to create four resonant modes, with the second and the fourth modes producing the desired $B_1$ profiles at the Larmor frequencies $\omega_0$ (e.g. 121.5 MHz and 300 MHz for $^{31}$P and $^1$H at 7 T).

To compare the performance of the doubly tunable double ring surface coil with single frequency one, two additional dual ring probes with the same ring sizes and current ratios (−1.4:1), tuned to either 121.5 MHz or 300 MHz were made. Experimental SNR measurements were obtained from a cylindrical (2.7 cm inner diameter) flask filled with 0.2 M phosphate buffer (pH 7.4). The selected VOI of 1 cm$^3$ was centered 1 cm from the bottom of the sample.

Measurements of the RF field strength demonstrated that the regions of $B_1$ homogeneity for both frequencies overlap and correlate with the theoretical calculations used to optimize $B_1$ within the VOI (FIG. 2). When operating at the $^1$H resonance frequency (300 MHz), the SNR of the doubly tunable double ring surface coil was 22, identical to that of the double ring single frequency coil. At the $^{31}$P resonant frequency (121.5 MHz) the SNR for the doubly tunable coil was about 72% of that of the single tuned coil.

The advantages of the probe include a low power requirement, a high sensitivity close to that of a traditional surface coil, and good field homogeneity within a desired VOI comparable to that of a volume coil. Suppression of signal from the surface, which is particularly important for $^{31}$P liver spectra, also eliminates a high phosphocreatine (PCr) signal from the abdominal wall thereby providing high quality spectra from liver in vivo. The performance of the coil for $^1$H MR is very similar to that of previously described dual ring single frequency coils, where an improvement in $B_1$ homogeneity and a reduction of outer voxel contamination compared to a standard surface coil were reported. The introduction of the frequency splitting network creates an additional resonance mode and thus broadens the spectrum of NMR experiments that can be performed. The doubly tunable coil produces better $B_1$ field homogeneity than standard double resonance surface coils and has a lower power requirement and a better SNR than double resonance volume coils (14–17).

The homogeneous $B_1$ region produced by a multi-ring coil can be designed for any depth and frequencies of interest. Construction is relatively simple and robust, as theoretical calculations are in good agreement with practice and the set-up ensures practically identical $B_1$ homogeneity at both frequencies. Another good feature is the suppression of signal from the surface, which is especially important for $^{31}$P liver spectra since a high PCr signal from abdominal wall can thus be avoided.

Although specifically designed for proton and phosphorus, the doubly tunable double ring surface coil can be adapted for a wide range of applications, and can be designed to have a region of high $B_1$ homogeneity at different depths and frequencies of interest.

Further improvements in the coil design are also possible. Introduction of more than one frequency splitting network will create additional resonance frequencies, giving for example a triply tunable coil. With a larger diameter for the large ring, the larger and deeper VOI can be sampled, but at the cost of reduced SNR.

The doubly tunable double ring surface coil presented in this study could be considered a "local volume coil" due to its ability to produce a homogenous $B_1$ over a selected VOI. While it provides the spatially localized homogeneous field of a volume coil, it requires considerably less RF power and produces a higher SNR than a volume coil. The two-resonance nature of the coil will facilitate a wide range of applications, particularly where sequential MR imaging and spectroscopy examinations are important. It would by particularly useful for the routine application of spectroscopic techniques in medical diagnosis to perform quickly and routinely sequential MR imaging and spectroscopy.

The doubly tunable double ring surface coil was also tested in MRI and MRS studies of rat liver in vivo. Experiments were carried out on a 7 T 21-cm horizontal bore magnet equipped with an MSLX Bruker console (Bruker, Karlsruhe, Germany). A FLASH proton image was acquired in the axial plane with TR/TE=3.7/2.2 ms, 2 mm slice thickness, 8×8 cm$^2$ field of view (FOV) and a matrix size of 128×128. A phosphorus spectrum was selected from a 2-D CSI experiment acquired with FOV 8.85 cm (horizontal)× 8.0 cm (vertical), TR=1 s, matrix size 8×8 zero-filled to 16×16, acquisition size 1k zero-filled to 4k, sweep width 4000 Hz, and processed with exponential line-broadening of 12 Hz and manual phase correction. Localized shimming on the liver was performed using a proton VOSY sequence with a 15×15×25 mm$^3$ (lateral, vertical and axial dimensions respectively) voxel with TE=20 ms, TM=30 ms. As can be seen from the spectrum, virtually no PCr contamination from abdominal muscle is observed.

Since various modifications can be made in my invention as herein above described, and many apparently widely different embodiments of same made within the spirit and scope of the claims without departing from such spirit and scope, it is intended that all matter contained in the accompanying specification shall be interpreted as illustrative only and not in a limiting sense.

What is claimed is:

1. A method for use in simultaneous nuclear magnetic resonance experiments at two different predetermined frequencies matched to the resonant frequencies of two different nuclei comprising:

providing a sample defining a volume of interest;

locating the sample in a magnetic field;

providing a surface probe arranged to lie adjacent a surface of the sample and offset to one side of the volume of interest;

arranging the probe to lie generally in a common plane for generating an RF field within the volume of interest adjacent to the plane;

providing a driver connected to a power source for generating within the surface probe an alternating current for generating said RF field;

the surface probe including two separate probe coils each forming a loop lying generally within the common plane with the loop of one of the coils inside the loop of the other of the coils, the separate probe coils being arranged to co-operate by mutual inductance to generate said RF field;

providing in each coil inductive and capacitive components arranged to tune the respective coil to at least two resonant frequencies different from said predetermined frequencies;

and selecting the values of the inductive and capacitive components relative to the construction and arrangement of the coils such that:

a) the resonant frequencies of the surface probe obtained by the co-operation of the two coils are matched to said predetermined frequencies;

b) the field strength of the RF field generated by the surface probe obtained by the co-operation of the two coils at each of the different resonant frequencies provides a peak of maximum homogeneity within the volume of interest at a predetermined distance spaced from the plane, thus reducing signals from a portion of the sample immediately adjacent the plane; and c) the predetermined distance for each of the frequencies is substantially equal.

2. The method according to claim 1 wherein the values of the inductive and capacitive components relative to the construction and arrangement of the coils are selected so as to provide for the peak at each resonant frequency a high Q.

3. The method according to claim 2 wherein Q is higher than 100.

4. The method according to claim 2 wherein Q is approximately the same for both peaks.

5. The method according to claim 1 wherein the step of providing a driver includes providing a matched coil tuned to the predetermined frequencies and locating the matched coil adjacent the probe to generate the current therein by mutual inductance.

6. The method according to claim 5 wherein fine tuning of the driver to either frequency is achieved by moving a strip of a foil between the matched coil and the probe.

7. The method according to claim 5 wherein matching of the inductance of the matched coil to that of the power source is effected by moving the matched coil in a plane parallel to that of the probe.

8. The method according to claim 1 wherein the inductive and capacitive components include a parallel LC trap.

9. The method according to claim 1 wherein the coils are coplanar.

10. The method according to claim 1 wherein the coils are annular.

11. The method according to claim 1 wherein the coils are coaxial.

12. A probe for use in simultaneous nuclear magnetic resonance experiments in a sample at two different predetermined frequencies matched to the resonant frequencies of two different nuclei in the sample comprising:
　a surface probe body arranged to lie substantially in a common plane for locating adjacent a surface of the sample and offset to one side of a volume of interest in the sample for generating an RF field within the sample;
　a driver for connection to a power source for generating within the surface probe body an alternating current for generating said RF field;
　the surface probe body including two separate probe coils each forming a loop lying generally within the common plane with the loop of one of the coils inside the loop of the other of the coils, the separate probe coils being arranged to co-operate by mutual inductance to generate said RF field;
　each coil having inductive and capacitive components arranged therein to tune the respective coil to at least two resonant frequencies different from said predetermined frequencies;
　the values of the inductive and capacitive components being selected relative to the construction and arrangement of the coils such that:
　　a) the resonant frequencies of the surface probe obtained by the co-operation of the two coils are matched to said predetermined frequencies;
　　b) the field strength of the RF field generated by the surface probe obtained by the co-operation of the two coils at each of the different resonant frequencies provides a peak of maximum homogeneity within the volume of interest at a predetermined distance spaced from the plane, thus reducing signals from a portion of the sample immediately adjacent the plane; and
　　c) the predetermined distance for each of the frequencies is substantially equal.

13. The probe according to claim 12 wherein the values of the inductive and capacitive components relative to the construction and arrangement of the coils are selected so as to provide for the peak at each resonant frequency a high Q.

14. The probe according to claim 13 wherein Q is higher than 100.

15. The probe according to claim 13 wherein Q is approximately the same for both peaks.

16. The probe according to claim 12 wherein the driver includes a matched coil tuned to the predetermined frequencies which is located adjacent the probe to generate the current therein by mutual inductance.

17. The probe according to claim 16 including a strip of a foil between the matched coil and the probe.

18. The probe according to claim 16 wherein the matched coil is movable in a plane parallel to that of the probe.

19. The probe according to claim 12 wherein the inductive and capacitive components include a parallel LC trap.

* * * * *

UNITED STATES PATENT AND TRADEMARK OFFICE
CERTIFICATE OF CORRECTION

PATENT NO. : 6,400,154 B2
DATED : June 4, 2002
INVENTOR(S) : Tomanek Buguslaw et al.

It is certified that error appears in the above-identified patent and that said Letters Patent is hereby corrected as shown below:

<u>Title page,</u>
Item [75], the city for the first inventor reads "Colpany" it should be corrected to read -- Calgary --; and the second inventor's name reads "Vyacheslav Vlolovskyy" it should be corrected to read -- Vyacheslav Volotovskyy --

Signed and Sealed this

Twenty-seventh Day of January, 2004

JON W. DUDAS
*Acting Director of the United States Patent and Trademark Office*